United States Patent [19]

Lewis

[11] Patent Number: 4,774,712

[45] Date of Patent: Sep. 27, 1988

[54] REDUNDANT STORAGE DEVICE HAVING ADDRESS DETERMINED BY PARITY OF LOWER ADDRESS BITS

[75] Inventor: Steven D. Lewis, Rochester, Minn.

[73] Assignee: International Business Machines Corporation, Armonk, N.Y.

[21] Appl. No.: 913,906

[22] Filed: Oct. 1, 1986

[51] Int. Cl.[4] .............................................. G06F 11/10
[52] U.S. Cl. ...................................................... 371/51
[58] Field of Search ....................... 371/13, 21, 49, 51, 371/22

[56] References Cited

U.S. PATENT DOCUMENTS

| | | |
|---|---|---|
| 4,271,521 | 6/1981 | Mahmood .............................. 371/51 |
| 4,346,474 | 8/1982 | Sze . | |
| 4,404,647 | 9/1983 | Jones et al. . | |
| 4,464,747 | 8/1984 | Groudon ................................ 371/51 |
| 4,464,754 | 8/1984 | Stewart ................................... 371/51 |

Primary Examiner—Michael R. Fleming
Attorney, Agent, or Firm—Bradley A. Forrest

[57] ABSTRACT

A memory device for storing data and providing address and data line error detection is disclosed. A memory holds two copies of data, each copy of data having opposite parity dependent on its address. An address sequencer provides addresses to the memory. The addresses are modified to select the copy of data in the memory having a predetermined first parity. A parity checker checks the parity of data provided by the memory and provides an error indication if the parity is incorrect, said error indication being indicative of address and data line errors and memory cell errors. When an error is indicated by an error latch, the error causes a retry of the memory in the location where the desired data is stored with parity opposite the first parity.

10 Claims, 2 Drawing Sheets

| Ap | Ao | A1 |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

| Dp | D0 | D1 | D2 | |
|---|---|---|---|---|
| 0 | 1 | 0 | 1 | EVEN |
| 0 | 0 | 0 | 1 | ODD |
| 1 | 1 | 1 | 0 | ODD |
| 1 | 1 | 1 | 1 | EVEN |
| 1 | 1 | 0 | 1 | ODD |
| 1 | 0 | 0 | 1 | EVEN |
| 0 | 1 | 1 | 0 | EVEN |
| 0 | 1 | 1 | 1 | ODD |

FIG. 2

| ACCESS ATTEMPT | ADDRESS GIVEN | ADDRESS CREATED | ADDRESS SEEN | DATA EXPECTED | DATA SEEN | RESULT |
|---|---|---|---|---|---|---|
| NO ERRORS | 00 | 100 | 100 | 1101 | 1101 | SUCCESS |
| Ap STUCK AT 0 | 11 | 111 / 011 | 011 / 011 | 0111 / 1111 | 1111 / 1111 | RETRY SUCCESS |
| Ao STUCK AT 0 | 11 | 111 / 011 | 101 / 001 | 0111 / 1111 | 1001 / 0001 | RETRY ERROR |
| Dp STUCK AT 1 | 01 | 001 / 101 | 001 / 101 | 0001 / 1001 | 1001 / 1001 | RETRY SUCCESS |
| Do STUCK AT 0 | 10 | 010 / 110 | 010 / 110 | 1110 / 0110 | 1010 / 0010 | RETRY ERROR |
| ARRAY BIT ERROR | 00 | 100 / 000 | 100 / 000 | 1101 / 0101 | 1001 / 0101 | RETRY SUCCESS |

FIG. 3

REDUNDANT STORAGE DEVICE HAVING ADDRESS DETERMINED BY PARITY OF LOWER ADDRESS BITS

BACKGROUND OF THE INVENTION

The invention relates to checking memories, and in particular to the checking of addresses used to access memories.

Errors in the address used to access a memory may result in incorrect data being retrieved from the memory. Checking logic may not detect errors in the memory itself or in the addressing lines of the memory. U.S. Pat. No. 4,271,521 to Mahmood detects errors in addressing as well as in the transfer and storage of data. Both odd and even parity are alternately assigned to data words as a function of the memory address where a particular data word is stored. A parity check is performed on both the data and address. While errors are detected, no means of correcting the errors are provided.

In U.S. Pat. No. 4,404,647 to Jones et al., two arrays contain identical data. When data is read, it is read from one of the arrays. If a data parity error is detected on readout, the other array is accessed. In this patent, no address line checking is provided. Data retrieved from a wrong address will appear to be correct.

It is an object of the invention to provide checking of addresses used to access a memory. It is a further object of the invention to provide for successfully retrying the memory in the event an error is detected. It is still a further object of the invention to provide parity on both data and address in conjunction with providing redundant copies of the data. It is yet a further object of the invention to provide a memory tolerant of having one particular address line or data access line impaired.

SUMMARY OF THE INVENTION

A memory is arranged for storing a first copy and a second copy of words. The different copies of words are stored with a different value of parity as a function of their addresses. A sequencer presents addresses to the memory corresponding to desired words having a first type of parity. A parity checker checks the parity of the word and provides an error signal if the parity is incorrect. On detection of the error signal, an address modifier modifies the address as a function of the error signal such that the second copy of a word having a second type of parity is addressed. The parity checker then checks the word using the second type of parity for comparison.

The parity checker monitors the error signal to determine which type of parity a given word will have. There is no requirement that the parity checker receive the address for the data in order to determine that a word at the wrong address was retrieved. Thus, much circuitry which would be required to provide the address to the parity checker has been eliminated, resulting in a simplified design.

A single selected address bit is used to differentiate the copies of words. One feature of the sequencer is that it generates the second type of parity from the address of the desired word. That parity is used as the differentiating address bit to select the location where a word is stored with the first type of parity during the first access attempt. The differentiating address bit is exclusive ORed with the error signal, such that a second access using the exclusive OR result as the differentiating address bit, following a first access failure, produces the copy of the word having the second type of parity.

A benefit of the present invention is that memory array and parity errors are correctable. Data and address line errors are detectable. In fact, some data and address line errors are correctable. If either the data line providing the parity stored with the data, or the address line carrying the differentiating address bit have failed, one of the access attempts will still be successful.

BRIEF DESCRIPTION OF THE DRAWINGS

FIG. 2 is a table of addresses and data stored in one particular embodiment of the circuit of FIG. 1.

FIG. 3 is a logic table of the operation of the memory arrangement in accordance with FIGS. 1 and 2 demonstrating the various modes of operation of the circuit.

DESCRIPTION OF THE PREFERRED EMBODIMENT

Figure 1:
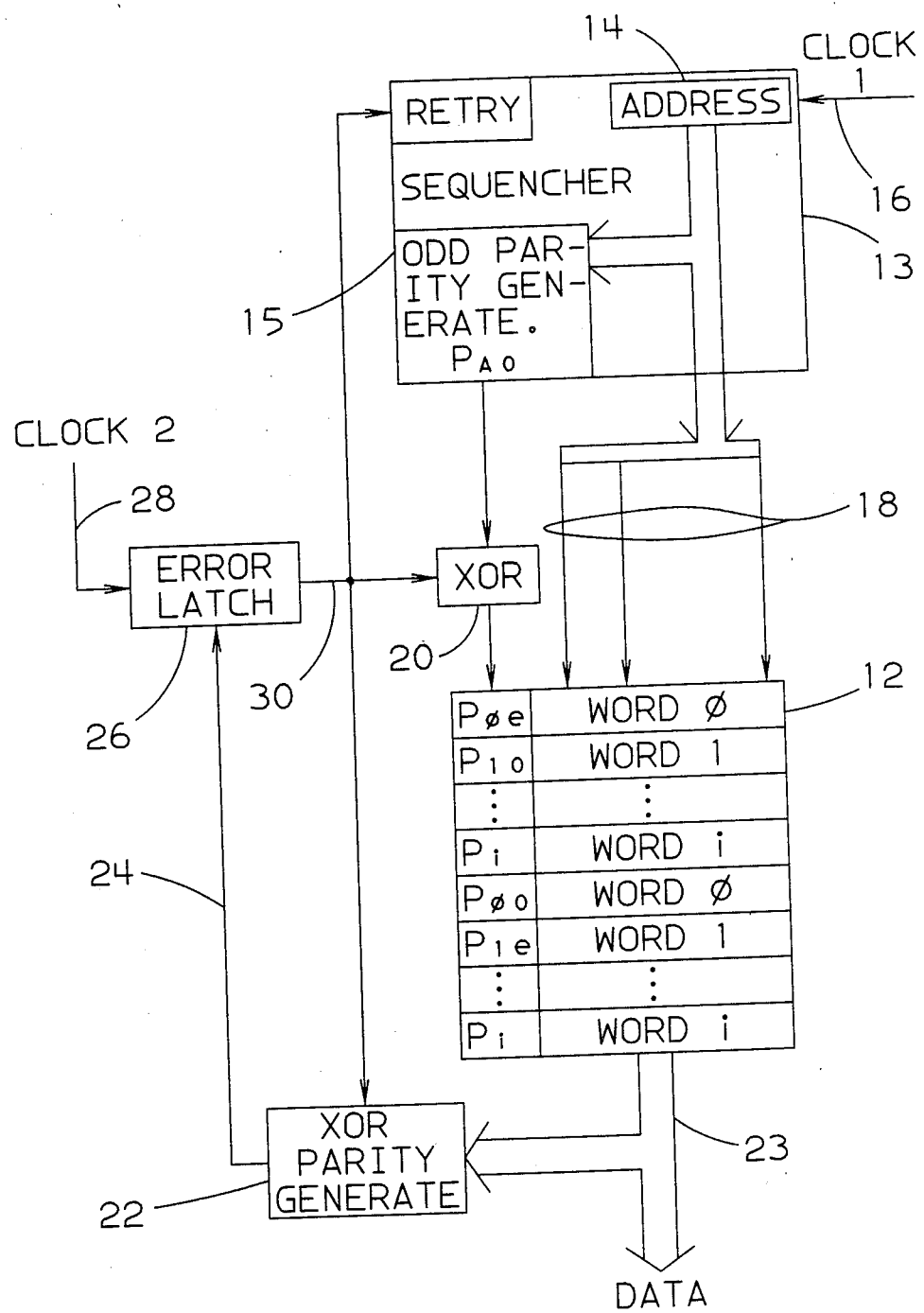
FIG. 1 is a block circuit diagram of a memory arrangement in accordance with the present invention.

A memory checking system is indicated in block diagram form generally at 10 in FIG. 1. A memory array 12, such as a non-volatile random access memory (NVRAM) or read only memory (ROM) stores data in the form of words in at least two locations. As shown, the pairs of words are stored in locations differing by a high order address bit, thus logically and visually dividing the array 12 in two halves. i words are stored in the array 12. Each word is stored with a parity bit $P_O$ through $P_i$, twice, with a different type parity each time. The bit used to differentiate the location of the pairs of words could easily be any bit in the address. The high order bit was chosen for simplicity.

One version of the words is stored with odd parity, while the other version of each word is stored with even parity. The type of parity a word is stored with at each location is a function of the address of that location. The half of the array from which a word is fetched is determined by a sequencer 13 which contains an address queue 14. The address contains the low order bits, defining where, within both halves of the array, a word is located.

Odd parity is generated on the low order bits of address of a word to be accessed by an odd parity generate block 15. Bit $P_{aO}$ in block 15 is the odd parity of the address bits generated by the sequencer 13. The odd parity of the address differentiates the half of array 12 where the word is located and also signifies where the word is stored with odd type parity. Thus, words stored with odd parity are spread to both halves of the array, with the other copy of the words stored with even parity spread to both halves of the array, with an address differing by only one bit. One use for array 12 involves the storage of vital product data (VPD) for I/O devices. VPD is stored in array 12 at the time of manufacture. The storage pattern is determined according to the scheme previously described. The data stored may contain items such as Part No., Serial No., date of manufacture, etc. NVRAM is written by external devices in a common manner.

When a word in array 12 is to be accessed, as caused by a clock pulse on a line 16, the sequencer 13 presents an address on address lines 18 to array 12. The odd parity of the address is provided unchanged through an exclusive OR block 20, to the array 12. The word and parity is then provided in a standard manner from the array 12 to a parity checker 22, via a data bus 23. Parity checker 22 generates parity by performing an exclusive OR of the word and its parity. An even number of logical "1's" in the word and parity will produce a "1" by the parity checker 22, while an odd number of "1's" produce a "0".

Since, during the first access attempt, words having odd parity are accessed, the exclusive OR by parity checker 22 provides no error signal on its output line 24 when the data and parity is correct, and when the data is retrieved from the correct location. Both the conditions that the data be correct, and that the data be retrieved from the correct location are covered by the parity bit. Since the location of the word to be fetched is determined consistent with the expectation of the word having odd parity, there is no requirement to compare the address used to fetch the word with the parity bit. The parity of the address was already checked by using it to identify the half of the array containing the word stored with even type parity.

If parity checker 22 generates a logical "1" on its output line 24, the "1" is clocked into an error latch 26 by a second clock 28 which occurs before first clock 16 clocks in a new address in sequencer 14. The error latch 26 provides the error signal on a line 30 to the sequencer 14, exclusive OR block 20 and parity checker 22. During normal, error free operation, the error signal line 30 has no effect on these three elements, it being at a logical "0". When an error is indicated by the parity checker on the first try in accessing a word, the error signal line 30 changes to "1". This triggers a retry by sequencer 14 on the next Clock 1 pulse. The address is again supplied to array 12, but this time, exclusive OR block 20 combines the parity of the address with the error signal, resulting in an address designating the half of the array having the word stored with even type parity.

The word stored with even type parity is then supplied to parity checker 22 which performs an exclusive OR of the word and its parity, and the error signal from line 30, which is a "1". If all is well, the parity checker provides a logic "0" on line 24 to the error latch 26, signaling that correct data and address was achieved on the second try. The error signal on line 30 is then changed back to "0" on the next pulse of Clock 2, and normal operation continues. If parity checker 22 provides a "1" on the retry, the sequencer signals a machine check, and operation stops.

In FIG. 2, a simple 8 word array is shown with addresses ($A_p, A_0, A_i$), data ($D_p, D_1, D_2$, parity $D_p$) and parity type (even or odd) indicated. There are four words stored twice, "101", "001", "110", and "111". At address location "000", the word "101" is stored with even type parity, the parity bit being "0". Word "101" is also stored at address location "100" with the odd type parity bit being "1". The word stored at address location "001" is stored with odd parity, and with even parity at the corresponding "101" address. Address locations "010" and "110" contain a word having odd and even parity respectively. Address location "011" and "111" contain words having even and odd parity respectively. The concept is easily expandable to larger arrays.

Several access attempts are represented in FIG. 3. The first address in the queue 14 of the sequencer 13 is "00". The parity checker of the sequencer 13 generates an odd parity, resulting in an address of "100", which is presented to the array 12. The data expected is the same as the data seen, "1101", where the "1" on the left is the parity bit included with the data. The data, including the parity bit, has an odd number of "1's", resulting in a "0" generated by the parity checker 22, and hence, a successful access.

The remaining access attempts in FIG. 3 deal with problems which may potentially be encountered with memories and their associated address and data lines. In attempt number 2, the high order address line from sequencer 13 is stuck at "0". When address "11" is presented by sequencer 13, it creates address "111". However, array 12 first sees address "011". The parity checker 22 is expecting data "0111", which has an odd number of "1's", but instead sees "1111" and generates a "1" on line 24, indicating an error. Even though there was no direct check on the address lines by parity checker 22, an error was detected.

Access attempt number 2 continues, this time with the error signal line 30 active, at logical "1". Exclusive OR block 20 changes the address created by sequencer 13 to "011" by exclusive ORing the parity address bit of "1" with the error signal of "1", resulting in "011" as the created and seen addresses. Thus data having an even parity type is expected, and seen at parity checker 22. The word and parity "1111" is combined at the parity checker 22 with the error signal on line 30 of "1" resulting in an odd number of "0's". Thus, parity checker 22 provides a "0" on line 24, indicating successful access. The address parity line was stuck at "0", yet a successful access occurred. Similar success would be encountered if the address parity line was stuck at "1" on the first try. Exclusive OR block 20 could take many forms, such as an inverter which is activated only when the error signal of "1" is present. Its main function is to switch the high order address bit, or discriminating bit to access the word with opposite parity on second attempts.

In access attempt number 3, address line 0 is stuck at "0". When an address of "11" is given, address "111" is created, but address "101" is presented to the array 12 resulting in data "1001" and a retry. On retry, the address line error continues, and the data seen is "0001". When that data is combined with the error signal, an even number of "1's" is seen at parity checker 22, and the sequencer is informed that an error condition exists.

The data parity bit line in the fourth access attempt is stuck at "1". The first try results in a retry because the parity bit should have been a "0" instead of the "1" that was seen at the parity checker 22. In the second attempt, success was achieved because even though the data parity line was stuck at "1", a "1" was expected by the parity checker 22. If the data parity bit line had been stuck at "0", success would have been achieved on the first try.

When an address line other than the address parity line is stuck, an error condition exists. Similarly, as indicated in access attempt number 5, a stuck data line will result in an error condition.

In access attempt number 6, an array bit error in data position "0" in the address "100" is encountered. The data expected is "1101" and the data seen, "1001" causes a retry. The retry addresses location "000", and the correct data "0101" resulting in success. All single array bit errors are detectable and correctable.

While the invention has been described with respect to an 8 word array, it can be seen that a much larger array would benefit from use of the invention. The invention finds particular use in cheaply storing device identification data in a low cost read only storage. Low cost memories inherently exhibit more errors than higher cost memories. By using the above described invention, the reliability of low cost memories is made very high. The simple circuitry used to access and check the data without processor intervention contribute to a low cost in implementing the invention.

What is claimed is:

1. A memory device for storing data and providing address and data line error detection comprising:
    memory means partitioned for holding two copies of data, each copy of data having opposite parity dependent on its address;
    sequencer means coupled to the memory means for providing address to the memory means, said addresses corresponding to the copy of data for provision by the memory means having a predetermined first parity;
    parity checking means coupled to the memory means for checking the parity of data provided by the memory means and providing an error indication if the parity is incorrect; and
    latch means coupled to the sequencer and the parity checker for receiving the error indication and causing a retry of the memory means in the location where the desired data is stored with parity opposite the first parity.

2. The memory device of claim 1 wherein the parity checking means provides an exclusive OR of the data, the data's parity, and the error indication from the latch means whereby the first try on data checks data for the first type of parity and the second try on data checks data for the opposite type of parity.

3. The memory device of claim 2 wherein the parity checking means provides a logical "0" to the latch means when presented with an odd number of "1"s and provides a logical "1" to the latch means when presented with an even number of "1"s such that the value of the error indication from the latch means is representative of the type of parity of the checked data.

4. The memory device of claim 1 wherein the sequencer means provides the address to the memory means, and one of the bits of the address is an address parity bit representing the parity of the other bits of the address, so that the address presented to the memory means on a first try identifies the location of the word stored with the first type of parity.

5. The memory device of claim 4 wherein the sequencer means further comprises modifying means coupled to the sequencer for modifying the address parity bit as a function of the error indication, such that a second try on data results in the address parity bit representing the location of the memory means wherein the data is stored with parity opposite that of the first type of parity.

6. The memory device of claim 5 wherein the address parity bit is the high order address bit, logically dividing the memory means in half, each half containing at least one copy of data having opposite parity types.

7. A method of accessing data in a storage device having at least two copies of data stored therein with parity dependent upon both the data and the address of the data, each copy having a different parity, comprising the steps of:
    (a) generating parity for an address;
    (b) including the address parity as a part of the address;
    (c) retrieving data stored at the address resulting from step b;
    (d) checking the retrieved data for a predetermined type of parity; and
    (e) indicating an error if the parity in a step d was incorrect.

8. The method of claim 7 and, if an error was indicated in step e, further comprising the steps of:
    (f) retrying the storage device for the other copy of the data; and
    (g) checking the data retrieved on the retry for a second type of parity.

9. A memory device for storing data and providing address and data line error detection comprising:
    memory means partitioned for holding two copies of data, each copy of data including at least one parity bit, and having opposite parity dependent on its address, said copies including a first copy having odd parity stored at memory means addresses having a first type of parity, and a second copy having even parity stored at memory means addresses having a second type of parity;
    an address queue containing address bits to identify desired data;
    sequence means coupled to the address queue and the memory means for generating addresses from the address queue address bits having the first parity and providing said addresses to the memory means, to access data having odd parity;
    parity checking means coupled to the memory means for checking the parity of data provided by the memory means and providing an error indication if the parity is incorrect; and
    latch means coupled to the sequencer and the parity checker for receiving the error indication and causing a retry of the memory means at addresses having a second type of parity so that data having even parity is accessed and checked by the parity checking means, said latch means further providing the parity checking means the error indication to cause said parity checking means to check the even parity data for even parity.

10. The memory device of claim 9 wherein the sequencer means comprises;
    an odd parity generator for generating an address parity bit based on address bits from the address queue, said parity bit being added to the address bits to create an address for presentation to the memory means having odd parity; and
    logic means coupled to the odd parity generator and the latch means for changing the address parity bit after receiving an error indication so that the address has even parity.

* * * * *